United States Patent
Wu et al.

(10) Patent No.: US 12,457,712 B2
(45) Date of Patent: Oct. 28, 2025

(54) COOLING SYSTEM AND DATA CENTER

(71) Applicant: Huawei Digital Power Technologies Co., Ltd., Shenzhen (CN)

(72) Inventors: Ruoxun Wu, Dongguan (CN); Malin Li, Xi'an (CN); Yuan Liu, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 681 days.

(21) Appl. No.: 17/846,196

(22) Filed: Jun. 22, 2022

(65) Prior Publication Data

US 2022/0418151 A1 Dec. 29, 2022

(30) Foreign Application Priority Data

Jun. 25, 2021 (CN) .......................... 202110709399.0

(51) Int. Cl.
*H05K 7/20* (2006.01)

(52) U.S. Cl.
CPC ....... *H05K 7/2079* (2013.01); *H05K 7/20272* (2013.01)

(58) Field of Classification Search
CPC .......................... H05K 7/2079; H05K 7/20272
See application file for complete search history.

(56) References Cited

U.S. PATENT DOCUMENTS

| | | | |
|---|---|---|---|
| 7,864,530 B1 | 1/2011 | Hamburgen et al. | |
| 2011/0271695 A1 | 11/2011 | Kashirajima et al. | |
| 2017/0268792 A1 | 9/2017 | Costakis et al. | |
| 2018/0305855 A1* | 10/2018 | Javit | D06F 75/12 |

FOREIGN PATENT DOCUMENTS

| | | | | | |
|---|---|---|---|---|---|
| CN | 104033997 A | * | 9/2014 | | |
| CN | 207836044 U | * | 9/2018 | | |
| CN | 109588016 A | * | 4/2019 | ......... | H05K 7/20745 |
| CN | 112797245 A | * | 5/2021 | | |

* cited by examiner

*Primary Examiner* — Devon Lane
(74) *Attorney, Agent, or Firm* — Maier & Maier, PLLC (57) ABSTRACT

A cooling system includes a first circulation pipeline unit and a second circulation pipeline unit that are configured to circulate a cooling medium. The first circulation pipeline unit includes a first water supply pipe group and a first water return pipe group that are connected to each other. The second circulation pipeline unit includes a second water supply pipe group and a second water return pipe group that are connected to each other. A first end of the first water supply pipe group and a first end of the first water return pipe group each are provided with a first expansion interface.

20 Claims, 5 Drawing Sheets

COOLING SYSTEM AND DATA CENTER

CROSS-REFERENCE TO RELATED APPLICATION

This application claims priority to Chinese Patent Application No. 202110709399.0, filed on Jun. 25, 2021, which is hereby incorporated by reference in its entirety.

TECHNICAL FIELD

The embodiments relate to the field of data center technologies, and a cooling system, and a data center.

BACKGROUND

Figure 1:
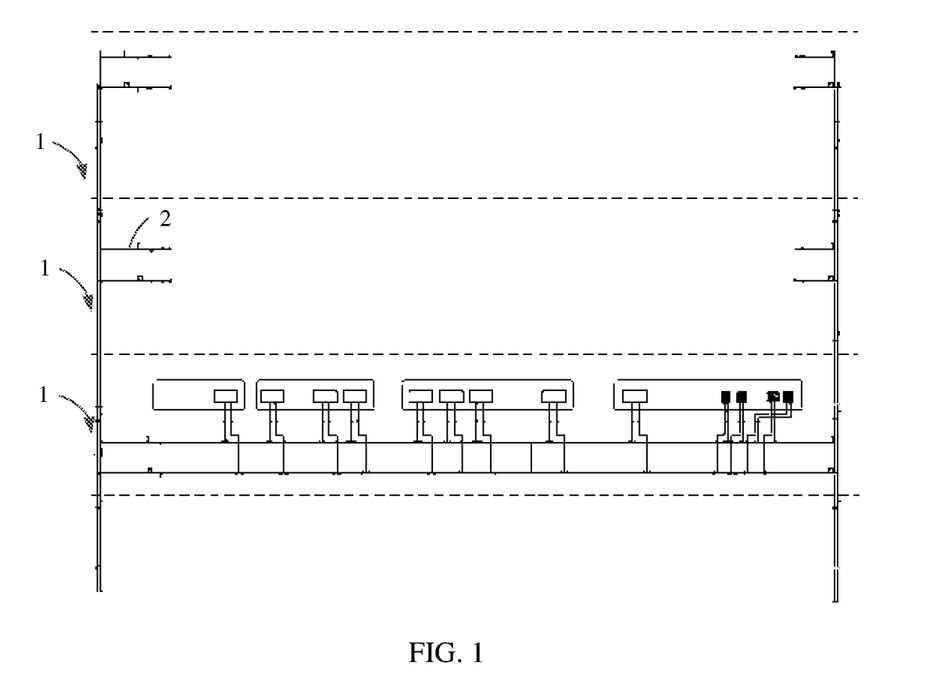
FIG. 1 is a schematic diagram of a structure of a pipeline layout in a conventional technology.

In recent years, a construction scale of a data center continuously increases. A large data center has a high cooling requirement. Therefore, a cooling system of a data center is also one of key indicators for measuring performance of the data center. Currently, equipment rooms of some data centers are disposed in buildings of civil engineering. As shown in FIG. 1, a pipe 2 in a cooling system of a large data center needs to be arranged in an equipment room 1 at each layer in advance during civil engineering, to facilitate later capacity expansion. A problem in this case lies in that, even if some floors have not served as equipment rooms, during early construction, a pipe interface is still reserved on each floor, a pipe is laid on each floor, and the like. This wastes early construction time and causes low resource utilization. In addition, if reserved pipe interfaces are insufficient, it is also difficult to expand a capacity of the data center in the future. As a result, a future cooling requirement of the data center cannot be met.

SUMMARY

The embodiments provide a cooling system and a data center. A first circulation pipeline unit and a second circulation pipeline unit in the cooling system are detachably connected to each other. When the cooling system is applied to a data center, the first circulation pipeline unit may be disposed only on a floor that serves as an equipment room. During subsequent expansion, the second circulation pipeline unit may be laid on a floor adjacent to the equipment room, and the first circulation pipeline unit is connected to the second circulation pipeline unit to expand a capacity of the data center, so as to reduce early construction time and improve resource utilization.

According to a first aspect, a cooling system may include a first circulation pipeline unit and a second circulation pipeline unit that are configured to circulate a cooling medium. The first circulation pipeline unit may include a first water supply pipe group and a first water return pipe group that are connected to each other. The second circulation pipeline unit may include a second water supply pipe group and a second water return pipe group that are connected to each other. A first end of the first water supply pipe group and a first end of the first water return pipe group each are provided with a first expansion interface. A second end of the second water supply pipe group and a second end of the second water return pipe group each are provided with a second expansion interface. The first expansion interface and the second expansion interface are detachably connected to each other. In addition, when the first expansion interface is disconnected from the corresponding second expansion interface, the first expansion interface is detachably connected to a first exhaust valve assembly. When the cooling system is applied to a data center and a capacity of the data center is not to be expanded, the first circulation pipeline unit is disposed in the current data center, to provide a cooling capacity for the current data center. In this case, the first expansion interface of the first water supply pipe group in the first circulation pipeline unit and the first expansion interface of the first water return pipe group in the first circulation pipeline unit each are connected to the first exhaust valve assembly, to ensure that the first circulation pipeline unit can work stably. When the current data center cannot meet an actual use requirement, the second circulation pipeline unit may be laid on a floor above the current data center; or a floor may be constructed above the current data center, and the second circulation pipeline unit is laid on the floor. After the second circulation pipeline unit is laid, the first exhaust valve assembly connected to the first expansion interface is removed, so that the first expansion interface is connected to the second expansion interface, to expand the cooling system and further expand the data center. In this disposing manner, early investment costs can be reduced, and an early data center can be expanded to meet a subsequent use requirement.

In a possible embodiment, the first expansion interface and the second expansion interface may be detachably connected by using a connecting assembly. The connecting assembly detachably connects the first expansion interface to the second expansion interface, to ensure that the cooling medium is circulated in the second circulation pipeline unit, so that a data center obtained through capacity expansion can operate stably.

In a possible embodiment, the first exhaust valve assembly may include a first gate valve and a first automatic exhaust valve, a first blind plate is disposed at a location at which each of the first water supply pipe group and the first water return pipe group is close to the first expansion interface, the first gate valve is mounted at the first expansion interface by using the first blind plate, and the first automatic exhaust valve is mounted on a side, of the first gate valve, that faces a first end of the first circulation pipeline unit.

In a possible embodiment, the first water supply pipe group may include a first main water supply pipe and a first branch water supply pipe, where a first end of the first main water supply pipe is provided with the first expansion interface, a second end of the first main water supply pipe may be connected to an outlet of a cooling unit, the first branch water supply pipe is connected to the first main water supply pipe, and a junction of the first branch water supply pipe and the first main water supply pipe is located between the first end and the second end of the first main water supply pipe; and the first water return pipe group may include a first main water return pipe and a first branch water return pipe, where a first end of the first main water return pipe is provided with the first expansion interface, a second end of the first main water return pipe is connected to an inlet of the cooling unit, the first branch water return pipe is connected to the first main water return pipe, a junction of the first branch water return pipe and the first main water return pipe is located between the first end and the second end of the first main water return pipe, the first branch water return pipe is connected to the first branch water supply pipe, and the first branch water supply pipe and the first branch water return pipe are configured to cool the current data center, so that the current data center can operate stably.

To enable the first circulation pipeline unit to operate stably and detect an operating status, a first functional element may be disposed on each of the first branch water supply pipe and the first branch water return pipe. The first functional element may be at least one of a first pressure gauge, a third gate valve, or a first thermometer.

In a possible embodiment, when the data center needs to be expanded, the second circulation pipeline unit is laid on the floor above the current data center. In addition, to circulate the cooling medium in the second circulation pipeline unit to cool the floor, the second expansion interface of the second circulation pipeline unit needs to be connected to the first expansion interface of the first circulation pipeline unit. In this case, to ensure a connection between the first expansion interface and the second expansion interface, the first exhaust valve assembly connected to the first expansion interface needs to be removed. In addition, during detaching, to prevent water leakage of the first circulation pipeline unit, a valve body assembly configured to control opening and closing of the first expansion interface is disposed in the first circulation pipeline unit. The valve body assembly may include two first valve bodies. A first valve body is disposed between a junction of the first main water supply pipe and the first branch water supply pipe and the corresponding first expansion interface. The other first valve body is disposed between a junction of the first main water return pipe and the first branch water return pipe and the corresponding first expansion interface. After the two first valve bodies are closed, the first exhaust valve assembly is removed, and the first expansion interface is connected to the second expansion interface.

In a possible embodiment, the second water supply pipe group may include a second main water supply pipe and a second branch water supply pipe, and the second water return pipe group may include a second main water return pipe and a second branch water return pipe, where a first end of the second main water supply pipe is provided with a second exhaust valve assembly, a second end of the second main water supply pipe is provided with the second expansion interface, the second expansion interface provided on the second main water supply pipe is detachably connected to the first expansion interface provided at the first end of the first main water supply pipe, a first end of the second main water return pipe is provided with a second exhaust valve assembly, a second end of the second main water return pipe is provided with the second expansion interface, and the second expansion interface provided on the second main water return pipe is detachably connected to the first expansion interface provided on the first end of the first main water return pipe. In this way, after the second circulation pipeline unit is laid on the floor above the current data center, the second expansion interface and the first expansion interface may be detachably fit, to expand the data center.

It should be noted that, when the second circulation pipeline unit is connected to the first circulation pipeline unit, the second circulation pipeline unit may be acid-washed and passivated to clean dirt such as oil stains, rust, oxide coating, and solder stains in a pipeline in the second circulation pipeline unit. In addition, a processed surface becomes uniformly silvery white, so that corrosion resistance performance of the pipeline in the second circulation pipeline unit can be improved. To conveniently acid-wash and passivate the second circulation pipeline unit, a drain valve assembly may be connected at the second expansion interface of the second water return pipe group, and a drain valve assembly is also connected at the second expansion interface of the second water supply pipe group. One drain valve assembly may serve as an interface, and the other drain valve assembly serves as a drain outlet.

The drain valve assembly may include a fifth gate valve, and the fifth gate valve is connected to the second expansion interface by using a third blind plate.

In addition, to enable the first circulation pipeline unit and the second circulation pipeline unit to operate stably after the second main water supply pipe and the second main water return pipe are connected to the first main water supply pipe and the first main water return pipe by using the connecting assembly, the first end of the second main water supply pipe and the first end of the second main water return pipe each are provided with a third expansion interface, and the third expansion interfaces of the second main water supply pipe and the second main water return pipe may be separately detachably connected to the second exhaust valve assembly. The second exhaust valve assembly may include a second gate valve and a second automatic exhaust valve. The second automatic exhaust valve is disposed at the first ends of the second main water supply pipe and the second main water return pipe. One end of the second gate valve is connected to the second automatic exhaust valve, and the other end of the second gate valve is connected to the corresponding third expansion interface by using a second blind plate.

In the foregoing embodiment, the connecting assembly may include a rigid connecting pipe and a flexible connecting pipe. One end of the rigid connecting pipe may be connected to the first expansion interface of the first circulation pipeline unit through a floor slab between two adjacent equipment rooms, the other end of the rigid connecting pipe may be connected to one end of the flexible connecting pipe, and the other end of the flexible connecting pipe may be connected to the second expansion interface of the second circulation pipeline unit, to expand the data center. Use of the flexible connecting pipe can facilitate a connection of a part of the rigid connecting pipe to the second expansion interface, thereby improving construction convenience. In addition, a casing may be sleeved on the flexible connecting pipe to reduce a probability of damage to the flexible connecting pipe.

According to a second aspect, a data center may be obtained through capacity expansion, including the cooling system in any one of the foregoing solutions and two layers of equipment rooms that are stacked. A first circulation pipeline unit is disposed in a lower-layer equipment room, and a second circulation pipeline unit is disposed in an upper-layer equipment room. The first circulation pipeline unit is disposed in the lower-layer equipment room (which may be regarded as a data center that exists before the capacity expansion), and the first circulation pipeline unit may cool a data unit in the lower-layer equipment room. The second circulation pipeline unit may be disposed in the upper-layer equipment room. Therefore, when a capacity of the data center needs to be expanded, the second circulation pipeline unit is laid in the upper-layer equipment room, and the first circulation pipeline unit is connected to the second circulation pipeline unit to expand the capacity. The upper-layer equipment room can be constructed in advance or during the capacity expansion.

In the foregoing embodiment, the data unit may include a plurality of detachably connected data modules. Each data module may be prefabricated, and the data modules may be assembled in an equipment room at each layer after construction of the equipment room is completed. In addition, the data modules may be a mechanical, electrical, and plumbing (MEP) module, an information technology IT)

module, and an electric power module. The data modules may be alternatively other modules that are not enumerated herein.

DETAILED DESCRIPTION OF THE EMBODIMENTS

To make objectives, solutions, and advantages clearer, the following further describes the embodiments in detail with reference to the accompanying drawings.

With development of information technologies, a demand for a data center grows rapidly. Internet service providers, enterprise platforms, research institutions, and the like all have huge computing demands. An operation platform that satisfies storage, computing, network, and other demands is referred to as a data center. Usually, during construction of a data center, design and construction need to be performed from both architectural and electromechanical aspects.

Currently, during construction of a data center, a building needs to be constructed on land first, and the building needs to be constructed with a designed quantity of layers, to meet an actual use requirement of the data center after the construction is completed. The foregoing conventional method has the following problems: First, a construction period of the building is long, thereby leading to an excessively long construction period of the data center. Second, based on characteristics of the building, it is inconvenient to expand a capacity of the data center in the future. In addition, when the data center is put into use in an early stage, only one or several layers of civil construction may be required to form one or several layers of equipment rooms to meet a use requirement. As a result, early investment costs are excessively high.

In view of this, a data center may allow equipment rooms at all layers of the data center to be constructed in different stages, thereby reducing early investment costs during construction of the data center.

Terms used in the following embodiments are merely intended to describe embodiments but are not intended to limit the embodiments. The terms "one", "a", "the", "the foregoing", "the abovementioned", and "this" of singular forms are also intended to include expressions such as "one or more", unless otherwise specified in the context clearly.

Reference to "an embodiment", "some embodiments", or the like indicates that one or more embodiments include a feature, structure, or characteristic described with reference to the embodiments. Therefore, statements such as "in an embodiment", "in some embodiments", "in some other embodiments", and "in other embodiments", that appear at different places do not necessarily mean referring to a same embodiment, instead, they mean "one or more but not all of the embodiments", unless otherwise emphasized. The terms "include", "contain", "have", and their variants all mean "including but not limited to", unless otherwise emphasized.

Figure 2:
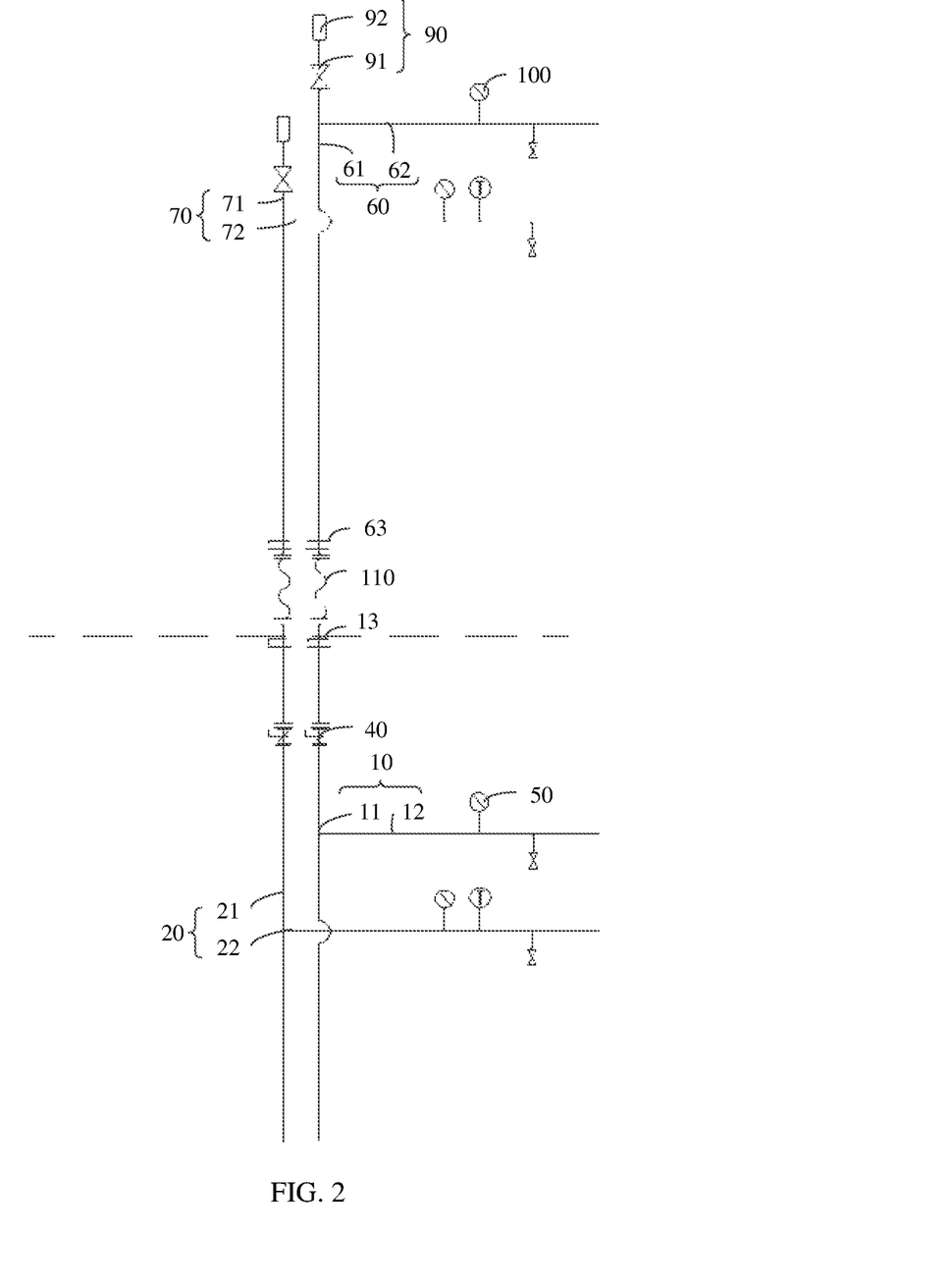
FIG. 2 is a schematic diagram of a structure in which two adjacent circulation pipeline units in a cooling system are connected according to an embodiment.
Figure 3:
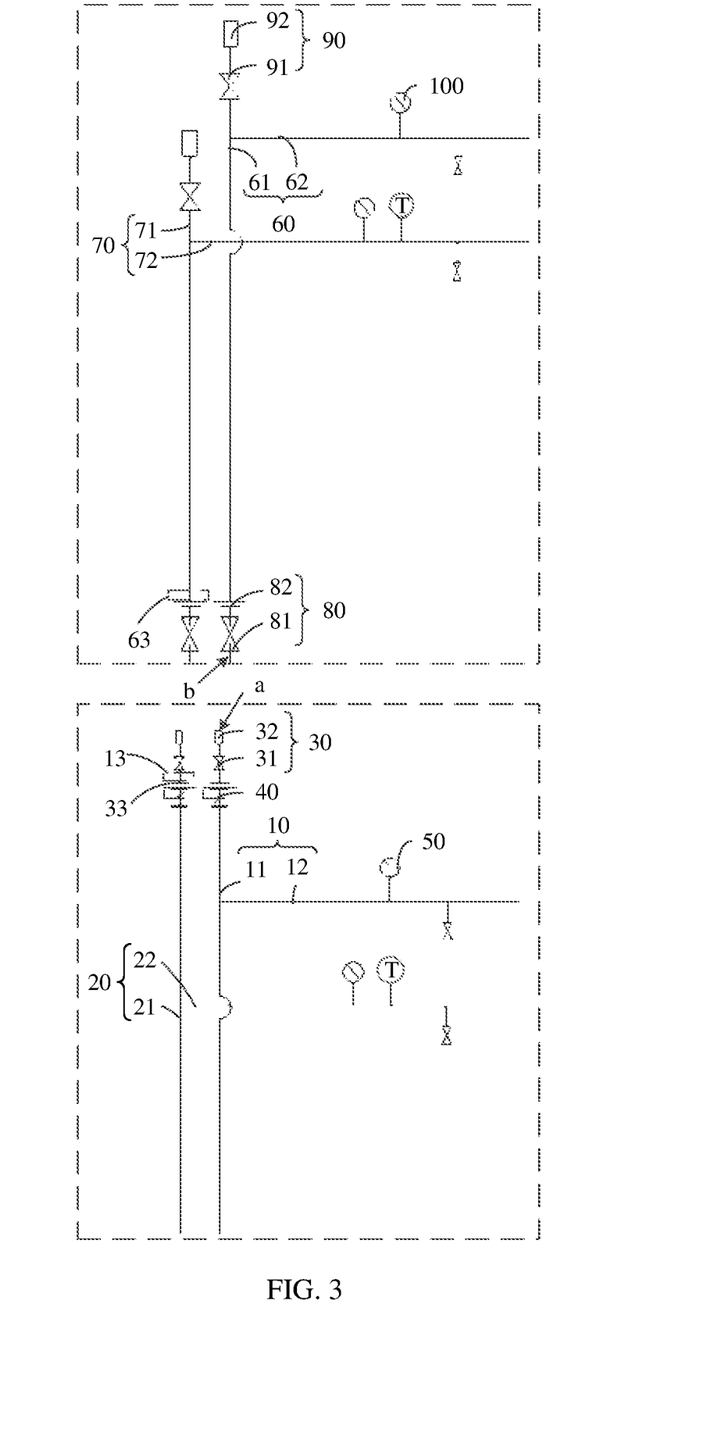
FIG. 3 is a schematic diagram of a structure in which two adjacent circulation pipeline units in a cooling system are disconnected according to an embodiment.

FIG. 2 is a schematic diagram of a structure in which two adjacent circulation pipeline units in a cooling system are connected. FIG. 3 is a schematic diagram of a structure in which the two circulation pipeline units in FIG. 2 are disconnected. For ease of understanding, a first end of a first water supply pipe group and a first end of a first water return pipe group is an end indicated by a in FIG. 3, and a second end of the second water supply pipe group and a second end of the second water return pipe group is an end indicated by b in FIG. 3. With reference to FIG. 2 and FIG. 3, the cooling system includes a first circulation pipeline unit and a second circulation pipeline unit. The first circulation pipeline unit and the second circulation pipeline unit may be configured to circulate a cooling medium. The first circulation pipeline unit may include a first water supply pipe group 10 and a first water return pipe group 20 that are connected to each other. The second circulation pipeline unit may include a second water supply pipe group 60 and a second water return pipe group 70 that are connected to each other. A first end of the first water supply pipe group 10 and a first end of the first water return pipe group 20 each are provided with a first expansion interface 13. A second end of the second water supply pipe group 60 and a second end of the second water return pipe group 70 each are provided with a second expansion interface 63. The first expansion interface 13 on the first water supply pipe group 10 is detachably connected to the second expansion interface 63 on the second water supply pipe group 60. The first expansion interface 13 on the second water return pipe group 20 is detachably connected to the second expansion interface 63 on the second water return pipe group 70. In addition, when the first expansion interface 13 is disconnected from the corresponding second expansion interface 63, the first expansion interface 13 is detachably connected to a first exhaust valve assembly 30. During implementation, the cooling system may be applied to a data center. When the data center does not need to be expanded, the first circulation pipeline unit may be disposed in a current equipment room. In this case, the first end of the first water supply pipe group 10 in the first circulation pipeline unit and the first end of the first water return pipe group 20 in the first circulation pipeline unit each are connected to a first exhaust valve assembly 30, so that the first circulation pipeline unit can operate stably and cool the current equipment room, to ensure stable operating of the current data center. When the data center needs to be expanded, the second circulation pipeline unit may be laid on a floor (the floor may be constructed in advance or may be a rebuilt floor) adjacent to the current equipment room. After the second water supply pipe group 60 and the second water return pipe group 70 in the second circulation pipeline unit are laid, the first exhaust valve assembly 30 connected to the first expansion interface 13 may be removed. Then the first water supply pipe group 10 is connected to the second water supply pipe group 60 by using the first expansion interface 13, and the first water return pipe group 20 is connected to the second water return pipe group 70 by using the second expansion interface 63, to expand the data center. In this disposing manner, equipment rooms of a quantity of layers actually required by the data center can be constructed according to a current requirement, thereby reducing early investment costs. In addition, when the quantity of layers of equipment rooms needs to be increased to expand a capacity of the data center, a second circulation pipeline unit in an equipment room in which capacity expansion needs to be performed can also be conveniently connected to the first circulation pipeline unit in the current equipment room of the data center.

It should be noted that, to enable the first circulation pipeline unit to operate stably when the first circulation pipeline unit is detachably connected to the second circulation pipeline unit, a valve body assembly configured to control opening and closing of the first expansion interface 13 may be disposed in the first circulation pipeline unit, so that the first expansion interface 13 is closed when the first exhaust valve assembly 30 is removed, to prevent leakage of the cooling medium in the first circulation pipeline unit.

In an embodiment, the first expansion interface 13 and the second expansion interface 63 may be detachably connected by using the connecting assembly 110, so that the first water supply pipe group 10 can be connected to the second water supply pipe group 60, and the first water return pipe group 20 can be connected to the second water return pipe group 70. This further ensures that a cooling medium in the first water supply pipe group 10 can enter the second water supply pipe group 60, and a cooling medium that has absorbed heat in the second water return pipe group 70 flows back to the first water return pipe group 20, so that the second circulation pipeline unit can operate stably.

During implementation, still with reference to FIG. 2 and FIG. 3, the first water supply pipe group 10 may include a first main water supply pipe 11 and a first branch water supply pipe 12. A first end of the first main water supply pipe 11 may be provided with the first expansion interface 13. The first branch water supply pipe 12 is connected to a side wall of the first main water supply pipe 11. The first water return pipe group 20 may include a first main water return pipe 21 and a first branch water return pipe 22. A first end of the first main water return pipe 21 may be provided with the first expansion interface 13. The first branch water return pipe 22 is connected to a side wall of the first main water return pipe 21, and the first branch water return pipe 22 is connected to the first branch water supply pipe 12. During implementation, when the data center does not need to be expanded, to ensure stable operating of the first circulation pipeline unit in the existing data center to discharge generated exhaust gas in a timely manner, the first exhaust valve assembly 30 is detachably connected to the first expansion interface 13 on the first main water supply pipe 11, and/or the first exhaust valve assembly 30 is also detachably connected to the first expansion interface 13 on the first main water return pipe 21, to ensure stable operating of the first circulation pipeline unit, so that the data center can operate stably at preset temperature.

Still with reference to FIG. 3, the first exhaust valve assembly 30 may include a first gate valve 31 and a first automatic exhaust valve 32. The first gate valve 31 may be mounted at the first end of the first main water supply pipe 11 and the first end of the first main water return pipe 21 by using a first blind plate 33. The first automatic exhaust valve 32 is disposed on a side, of the first gate valve 31, that is away from the second end of the first main water supply pipe 11 and the second end of the first main water return pipe 21. The first blind plate 33 is disposed to facilitate mounting of the first gate valve 31.

It should be noted that, to ensure stable operating of the first circulation pipeline unit and record various parameters of the first circulation pipeline unit, a plurality of first functional elements 50 may be disposed on the first branch water supply pipe 12 and the first branch water return pipe 22. The first functional elements 50 may include a first pressure gauge, a first thermometer, and a third gate valve.

A first pressure gauge and a third gate valve may be disposed on the first branch water supply pipe 12, where the first pressure gauge may detect pressure of a cooling medium that enters the first branch water supply pipe 12 from the first main water supply pipe 11, and the third gate valve may be adjusted to adjust a flow rate of the cooling medium that enters the first branch water supply pipe 12; and a first pressure gauge, a third gate valve, and a first thermometer may be disposed on the first branch water return pipe 22, where the first pressure gauge disposed on the first branch water return pipe 22 may detect pressure of a cooling medium that has absorbed heat, the first thermometer may detect temperature of the cooling medium that has absorbed heat, and the third gate valve disposed on the first branch water return pipe 22 may be adjusted to adjust a speed at which the cooling medium that has absorbed heat flows out, to adjust a time in which the cooling medium is in the first circulation pipeline unit.

In an embodiment, when the data center cannot meet an actual use requirement, a new floor may be constructed above the equipment room of the current data center (or an existing floor on which no data center is formed is used), and the second circulation pipeline unit is laid on the newly constructed floor. The second circulation pipeline unit may be prefabricated to increase a speed at which the second circulation pipeline unit is laid and reduce an onsite detection time. In addition, the second water supply pipe group 60 in the second circulation pipeline unit may include a second main water supply pipe 61 and a second branch water supply pipe 62. The second branch water supply pipe 62 is connected to a side wall of the second main water supply pipe 61. A second end of the second main water supply pipe 61 is provided with the second expansion interface. The second expansion interface 63 on the second main water supply pipe 61 may be detachably connected to the first expansion interface 13 on the first main water supply pipe 11 by using the connecting assembly 110. The second water return pipe group 70 may include a second main water return pipe 71 and a second branch water return pipe 72. The second branch water return pipe 72 is connected to a side wall of the second main water return pipe 71. A second end of the second water return pipe 71 is provided with the second expansion interface 63. A first end of the second water supply pipe group 60 is provided with a third expansion interface, and a first end of the second water return pipe group 70 may also be provided with a third expansion interface. If capacity expansion does not need to be further performed at a higher layer, a first end of the second main water return pipe 71 is provided with a second exhaust valve assembly 90, and/or a first end of the second main water supply pipe 61 may also be provided with a second exhaust valve assembly 90. The second exhaust valve assembly 90 is detachably connected to the third expansion interface, so that the second exhaust valve assembly 90 is quickly connected to the second water supply pipe group 60 and the second water return pipe group 70.

The second exhaust valve assembly 90 may include a second gate valve 91 and a second automatic exhaust valve 92. One end of the second gate valve 91 is mounted to the third expansion interface of the second water supply pipe group 60 and the third expansion interface of the second water return pipe group 70 by using a second blind plate. The second automatic exhaust valve 92 is connected to the other end of the second gate valve 91.

When the second main water return pipe 71 in the second circulation pipeline unit is connected to the first main water return pipe 21 by using the connecting assembly 110 and the second main water supply pipe 61 is connected to the first main water supply pipe 11 by using the connecting assembly 110, the first automatic exhaust valve assembly 30 connected to the first end of the first main water return pipe 21 and/or the first automatic exhaust valve assembly 30 connected to the first end of the first main water supply pipe 11 need/needs to be removed. The valve body assembly may include two first valve bodies 40 to prevent leakage of the cooling medium in the first main water return pipe 21 and the first main water supply pipe 11 when the first automatic exhaust valve assembly 30 is removed. One first valve body 40 may be disposed at the first end of the first main water return pipe 21, and the other first valve body 40 may be disposed at the first end of the first main water supply pipe 11. The first valve body 40 is closed when the first automatic exhaust valve assembly 30 is removed, to ensure that water in the first main water return pipe 21 and the first main water supply pipe 11 does not leak. The first valve body 40 may be a manual butterfly valve. In addition, when the first valve body 40 is closed, the cooling medium in the first main water supply pipe 11 may be circulated by passing through the first branch water supply pipe 12, the first branch water return pipe 22, and the first main water return pipe 21, to ensure that the cooling medium still passes through the first circulation pipeline unit and the equipment room in which the first circulation pipeline unit is located can still operate stably. In this way, operating of the existing equipment room is not affected during the capacity expansion of the data center. Before the second circulation pipeline unit is detachably connected to the first circulation pipeline unit, the second circulation pipeline unit may be acid-washed and passivated to clean dirt such as oil stains, rust, oxide coating, and oil stains in a pipeline in the second circulation pipeline unit. In addition, a processed surface becomes uniformly silvery white, so that corrosion resistance performance of the pipeline in the second circulation pipeline unit can be improved. To conveniently acid-wash and passivate the second circulation pipeline unit, a drain valve assembly 80 may be connected at the second expansion interface 63 of the second main water return pipe 72, and a drain valve assembly 80 is also connected at the second expansion interface of the second main water supply pipe 61. One drain valve assembly 80 may serve as an interface, and the other drain valve assembly 80 serves as a drain outlet.

The drain valve assembly 80 may include a fifth gate valve 81, and the fifth gate valve 81 is connected to the second expansion interface 63 by using a third blind plate 82. In use, opening and closing of the drain valve assembly 80 may be adjusted by directly adjusting the fifth gate valve 81. In addition, when the second expansion interface 63 is connected to the connecting assembly 110, the fifth gate valve 81 may be removed, or the fifth gate valve 81 may be kept in a normally open state, to ensure that the second circulation pipeline unit is connected to the first circulation pipeline unit.

To ensure operating stability of the second circulation pipeline unit, a second functional element 100 may be disposed on the second branch water supply pipe 62 and the second branch water return pipe 72. The second functional element 100 may include at least one of a second pressure gauge, a fourth gate valve, and a second thermometer. A second pressure gauge and a fourth gate valve may be disposed on the second branch water supply pipe 62, where the second pressure gauge may detect pressure of a cooling medium that enters the second branch water supply pipe 62 from the second main water supply pipe 61, and the fourth gate valve may be adjusted to adjust a flow rate of the cooling medium that enters the second branch water supply pipe 62; and a second pressure gauge, a fourth gate valve, and a second thermometer may be disposed on the second branch water return pipe 72, where the second pressure gauge disposed on the second branch water return pipe 72 may detect pressure of a cooling medium that has absorbed heat, the second thermometer may detect temperature of the cooling medium that has absorbed heat, and the fourth gate valve disposed on the second branch water return pipe 72 may be adjusted to adjust a speed at which the cooling medium that has absorbed heat flows out, to adjust a time in which the cooling medium is in a next-layer equipment room. In addition, the fourth gate valve disposed on the second branch water return pipe 72 may perform a pressure hold test on the second circulation pipeline unit.

In the foregoing embodiment, a second valve body may also be disposed in the second circulation pipeline unit. Two second valve bodies may be respectively disposed in the second water supply pipe group 60 and the second water return pipe group 70. When a data center obtained through capacity expansion cannot meet a use requirement, the second exhaust valve assembly 90 may be alternatively removed from the third expansion interface, and the second valve body is closed, so that the third expansion interface is connected to an expansion interface of a subsequent circulation pipeline unit (for example, a third circulation pipeline unit), to expand a capacity of the data center obtained through capacity expansion again. For a method for connecting the third expansion interface to the third circulation pipeline unit herein, refer to the connection between the first expansion interface and the second expansion interface. In this embodiment, one circulation pipeline unit is disposed at one layer, an exhaust valve assembly between expansion interfaces of circulation pipeline units at different layers is removed, and then the expansion interfaces are connected by using a connecting assembly, to synchronously expand a capacity of the cooling system while expanding the capacity of the data center.

In the foregoing embodiment, the connecting assembly 110 that connects the first expansion interface 13 to the second expansion interface 63 may include a rigid connecting pipe and a flexible connecting pipe. One end of the rigid connecting pipe may be connected to the first expansion interface through a floor slab between two adjacent equipment rooms, the other end of the rigid connecting pipe may be connected to the flexible connecting pipe, and an end, of the flexible connecting pipe, that is away from the rigid connecting pipe may be connected to the second expansion interface 63, so that the first expansion interface 13 is connected to the second expansion interface 63 to expand the data center. In addition, disposing of the flexible connecting pipe can improve convenience for connecting the rigid connecting pipe to the second expansion interface 63.

It should be noted that, after the flexible connecting pipe connects the rigid connecting pipe to the second expansion interface, to reduce a probability of damage to the flexible connecting pipe, a casing may be sleeved on the flexible connecting pipe, to wrap the flexible connecting pipe.

Figure 4:
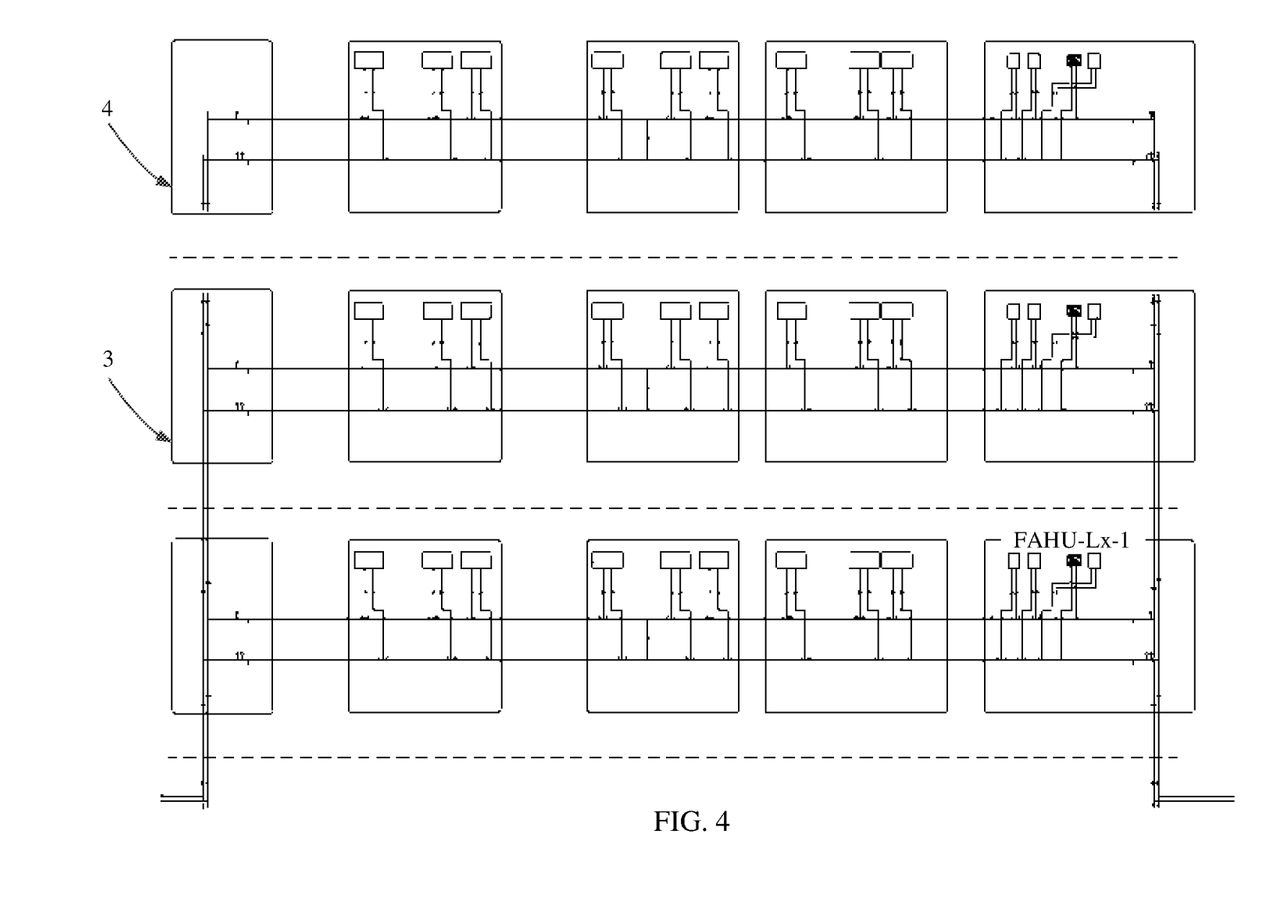
FIG. 4 is a schematic diagram of a structure of a data center according to an embodiment.
Figure 5:
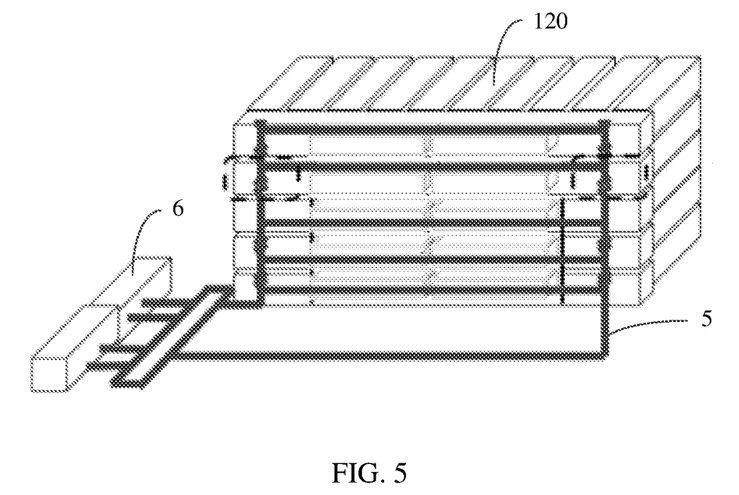
FIG. 5 is a schematic diagram of an application scenario of a data center according to an embodiment.

In the foregoing embodiment, FIG. 4 is a schematic diagram of a structure of a data center, and FIG. 5 is a schematic diagram of an application scenario of the data center. A part in a dashed-line box in FIG. 5 indicates a part of a connection between a first expansion interface and a second expansion interface during capacity expansion. With reference to FIG. 4 and FIG. 5, the data center includes the cooling system 5 in any one of the foregoing solutions and two layers of equipment rooms that are stacked. A first circulation pipeline unit is disposed in a lower-layer equipment room 3. A second circulation pipeline unit is disposed in an upper-layer equipment room 4. During implementation, the first circulation pipeline unit 3 may be connected to a cooling unit 6, and the cooling unit 6 may cool a cooling medium. The first circulation pipeline unit provides a cooling capacity for a data unit 120 (a server, a power supply apparatus, or the like) in the lower-layer equipment room 3, to ensure stable operating f the lower-layer equipment room 3. When the lower-layer equipment room 3 cannot meet a use requirement of the data center, a data unit 120 may be disposed in the upper-layer equipment room 4, and the first circulation pipeline is connected to the second circulation pipeline unit, to expand a capacity of the data center.

It should be noted that, the data unit 120 may include a plurality of detachably connected data modules, and the data modules may be prefabricated. The prefabricated data modules are assembled on a construction site, to increase a capacity expansion speed. The data module may be a mechanical, electrical, and plumbing module, an information technology module, and an electric power module, but are not limited to the foregoing modules. In addition, because a circulation pipeline unit at each layer of equipment room may be prefabricated in a factory, when circulation pipeline units in two adjacent equipment rooms are connected by using a connecting assembly, only a junction needs to be tested, thereby reducing detection duration.

During capacity expansion of the data center, the upper-layer equipment room 4 needs to be constructed above the lower-layer equipment room 3. The following operations are required for further configuring the cooling system for a data center obtained through capacity expansion:

arranging the second circulation pipeline unit in the upper-layer equipment room 4;

performing a pressure hold test on the second circulation pipeline unit, and acid-washing and passivating the second circulation pipeline unit;

closing a first valve body in the first circulation pipeline unit in the lower-layer equipment room 3, and removing a first exhaust valve assembly connected to a first expansion interface of the lower-layer equipment room 3; and connecting a second expansion interface of the upper-layer equipment room 4 to the first expansion interface of the lower-layer equipment room 3 by using the connecting assembly, to complete configuration of the cooling system for the data center obtained through capacity expansion.

The foregoing descriptions are merely implementations of the embodiments, but are not intended to limit the scope of the embodiments. Any variation or replacement readily figured out by a person skilled in the art within the scope of the embodiments.

What is claimed is:

1. A cooling system, comprising
a first circulation pipeline unit comprising a first water supply pipe group and a first water return pipe group; and
a second circulation pipeline unit comprising a second water supply pipe group and a second water return pipe group, wherein the first circulation pipeline unit and the second circulation pipeline unit are configured to circulate a cooling medium;
the first water supply pipe group and the first water return pipe group are connected to each other, and the second water supply pipe group and the second water return pipe group are connected to each other,
a first end of the first water supply pipe group and a first end of the first water return pipe group each are provided with a first expansion interface, a second end of the second water supply pipe group and a second end of the second water return pipe group each are provided with a second expansion interface, the first expansion interface of the first water supply pipe group is detachably connectable to the second expansion interface of the second water supply pipe group, and the first expansion interface of the first water return pipe group is detachably connectable to the second expansion interface of the second water return pipe group; and
when the first expansion interface is disconnected from the corresponding second expansion interface, the first expansion interface of the first water supply pipe group and the first expansion interface of the first water return pipe group each are detachably connected to a first exhaust valve assembly.

2. The cooling system according to claim 1, wherein the first exhaust valve assembly further comprises:
a first gate valve; and
a first automatic exhaust valve; and
one end of the first gate valve is connected to the first automatic exhaust valve, and the other end of the first gate valve is connected to the corresponding first expansion interface by using a first blind plate.

3. The cooling system according to claim 1, wherein the first water supply pipe group further comprises:
a first main water supply pipe; and
a first branch water supply pipe connected to the first main water supply pipe, and a first end of the first main water supply pipe is provided with the first expansion interface; and
the first water return pipe group comprises a first main water return pipe and a first branch water return pipe connected to the first main water return pipe, a first end of the first main water return pipe is provided with the first expansion interface, and the first branch water return pipe is connected to the first branch water supply pipe.

4. The cooling system according to claim 2, wherein the first water supply pipe group further comprises:
a first main water supply pipe; and
a first branch water supply pipe connected to the first main water supply pipe, and a first end of the first main water supply pipe is provided with the first expansion interface; and
the first water return pipe group comprises a first main water return pipe and a first branch water return pipe connected to the first main water return pipe, a first end of the first main water return pipe is provided with the first expansion interface, and the first branch water return pipe is connected to the first branch water supply pipe.

5. The cooling system according to claim 3, wherein the first circulation pipeline unit further comprises:
a valve body assembly configured to control opening and closing of the first expansion interface, the valve body assembly comprises two first valve bodies, the two first valve bodies are respectively disposed in the first main water supply pipe and the first main water return pipe, one first valve body is disposed between a junction of the first branch water supply pipe and the first main water supply pipe and the corresponding first expansion interface, and the other first valve body is disposed between a junction of the first branch water return pipe and the first main water return pipe and the corresponding first expansion interface.

6. The cooling system according to claim 1, wherein a first end of the second water supply pipe group and a first end of the second water return pipe group each are provided with a third expansion interface.

7. The cooling system according to claim 6, wherein the third expansion interface of the second water supply pipe group and the third expansion interface of the second return water pipe group are separately detachably connectable to a second exhaust valve assembly.

8. The cooling system according to claim 7, wherein the second exhaust valve assembly further comprises:
a second gate valve; and
a second automatic exhaust valve; and
one end of the second gate valve is connected to the second automatic exhaust valve, and the other end of the second gate valve is connected to the corresponding third expansion interface by using a second blind plate.

9. The cooling system according to claim 6, wherein the second water supply pipe group further comprises:
a second main water supply pipe; and
a second branch water supply pipe connected to the second main water supply pipe, a first end of the second main water supply pipe is provided with the third expansion interface, and a second end of the second main water supply pipe is provided with the second expansion interface detachably connectable to the first expansion interface; and
the second water return pipe group comprises a second main water return pipe and a second branch water return pipe connected to the second main water return pipe, a first end of the second main water return pipe is provided with the third expansion interface, a second end of the second main water return pipe is provided with the second expansion interface detachably connectable to the first expansion interface, and the second branch water return pipe is connected to the second branch water supply pipe.

10. The cooling system according to claim 7, wherein the second water supply pipe group further comprises:
a second main water supply pipe; and
a second branch water supply pipe connected to the second main water supply pipe, a first end of the second main water supply pipe is provided with the third expansion interface, and a second end of the second main water supply pipe is provided with the second expansion interface detachably connectable to the first expansion interface; and
the second water return pipe group further comprises:
a second main water return pipe; and
a second branch water return pipe connected to the second main water return pipe, a first end of the second main water return pipe is provided with the third expansion interface, a second end of the second main water return pipe is provided with the second expansion interface detachably connectable to the first expansion interface, and the second branch water return pipe is connected to the second branch water supply pipe.

11. The cooling system according to claim 8, wherein the second water supply pipe group further comprises:
a second main water supply pipe; and
a second branch water supply pipe connected to the second main water supply pipe, a first end of the second main water supply pipe is provided with the third expansion interface, and a second end of the second main water supply pipe is provided with the second expansion interface detachably connectable to the first expansion interface; and
the second water return pipe group further comprises:
a second main water return pipe; and
a second branch water return pipe connected to the second main water return pipe, a first end of the second main water return pipe is provided with the third expansion interface, a second end of the second main water return pipe is provided with the second expansion interface detachably connectable to the first expansion interface, and the second branch water return pipe is connected to the second branch water supply pipe.

12. The cooling system according to claim 6, further comprising:
a drain valve assembly configured to be detachably connectable to the second expansion interface of the second water supply pipe group and the second expansion interface of the second water return pipe group.

13. The cooling system according to claim 1, further comprising:
a connecting assembly, wherein the connecting assembly is configured to be detachably connectable to the first expansion interface to the second expansion interface.

14. The cooling system according to claim 2, further comprising:
a connecting assembly, wherein the connecting assembly is configured to be detachably connectable to the first expansion interface to the second expansion interface.

15. The cooling system according to claim 3, further comprising:
a connecting assembly, wherein the connecting assembly is configured to be detachably connectable to the first expansion interface to the second expansion interface.

16. The cooling system according to claim 13, wherein the connecting assembly further comprises:
a rigid connecting pipe; and
a flexible connecting pipe, one end of the rigid connecting pipe is connected to the first expansion interface, the other end of the rigid connecting pipe is connected to the flexible connecting pipe, and the flexible connecting pipe is connected to the second expansion interface.

17. The cooling system according to claim 16, wherein the connecting assembly further comprises:
a casing, and the casing is sleeved on the flexible connecting pipe.

18. The cooling system according to claim 1, wherein when the first circulation pipeline unit is an underlying circulation pipeline unit, a second end of the first water supply pipe group is connected to an outlet of a cooling unit, and a second end of the first water return pipe group is connected to an inlet of the cooling unit; and the cooling unit is configured to provide the cooling medium for the first water supply pipe group.

19. The cooling system according to claim 2, wherein when the first circulation pipeline unit is an underlying circulation pipeline unit, a second end of the first water supply pipe group is connected to an outlet of a cooling unit, and a second end of the first water return pipe group is connected to an inlet of the cooling unit; and the cooling unit is configured to provide the cooling medium for the first water supply pipe group.

20. A data center, comprising a cooling system, wherein the cooling system comprises:
a first circulation pipeline unit comprising a first water supply pipe group and a first water return pipe group; and a second circulation pipeline unit comprising a second water supply pipe group and a second water return pipe group, wherein the first circulation pipeline unit and the second circulation pipeline unit are configured to circulate a cooling medium;

the first water supply pipe group and the first water return pipe group are connected to each other, and the second water supply pipe group and the second water return pipe group are connected to each other;

a first end of the first water supply pipe group and a first end of the first water return pipe group each are provided with a first expansion interface, a second end of the second water supply pipe group and a second end of the second water return pipe group each are provided with a second expansion interface, the first expansion interface of the first water supply pipe group is detachably connectable to the second expansion interface of the second water supply pipe group, and the first expansion interface of the first water return pipe group is detachably connectable to the second expansion interface of the second water return pipe group; and when the first expansion interface is disconnected from the corresponding second expansion interface, the first expansion interface of the first water supply pipe group and the first expansion interface of the first water return pipe group each are detachably connected to a first exhaust valve assembly;

and the data center further comprising:

two layers of equipment rooms that are stacked, wherein the first circulation pipeline unit is disposed in a lower-layer equipment room, and the second circulation pipeline unit is disposed in an upper-layer equipment room.

* * * * *